United States Patent [19]

Koc et al.

[11] Patent Number: 5,796,171
[45] Date of Patent: Aug. 18, 1998

[54] PROGRESSIVE STAGGERED BONDING PADS

[75] Inventors: Aydin Koc, Millbrae; Michael J. Steidl, Fremont; Sanjay Dandia, San Jose, all of Calif.

[73] Assignee: LSI Logic Corporation, Milpitas, Calif.

[21] Appl. No.: 712,981

[22] Filed: Sep. 16, 1996

Related U.S. Application Data

[63] Continuation-in-part of Ser. No. 660,490, Jun. 7, 1996.

[51] Int. Cl.[6] .......................... H01L 23/48; H01L 23/52; H01L 29/40; H01L 27/10
[52] U.S. Cl. .......................... 257/786; 257/784; 257/202; 257/203
[58] Field of Search .......................... 257/786, 781, 257/784, 690, 691, 697, 694, 666, 48, 202, 203

[56] References Cited

U.S. PATENT DOCUMENTS

| | | | |
|---|---|---|---|
| 4,881,029 | 11/1989 | Kawamura | 324/158 |
| 4,974,053 | 11/1990 | Kinoshita et al. | 357/68 |
| 5,155,065 | 10/1992 | Schweiss | 437/209 |
| 5,177,668 | 1/1993 | Lederer et al. | 257/786 |
| 5,285,082 | 2/1994 | Axer | 257/48 |
| 5,329,157 | 7/1994 | Rostoker | 257/666 |
| 5,396,032 | 3/1995 | Bonham, Jr. et al. | 174/52.4 |
| 5,420,460 | 5/1995 | Massingill | 257/693 |
| 5,424,248 | 6/1995 | Doi | 437/209 |
| 5,441,917 | 8/1995 | Rostoker et al. | 437/195 |
| 5,444,303 | 8/1995 | Greenwood et al. | 257/786 |
| 5,453,583 | 9/1995 | Rostoker et al. | 174/267 |
| 5,498,767 | 3/1996 | Huddleston et al. | 437/8 |
| 5,532,934 | 7/1996 | Rostoker | 364/488 |

FOREIGN PATENT DOCUMENTS

| | | | |
|---|---|---|---|
| 4-269856 | 9/1992 | Japan | 257/666 |
| 4-364051 | 12/1992 | Japan | 257/784 |
| 5-36947 | 2/1993 | Japan | 257/786 |

*Primary Examiner*—Mahshid D. Saadat
*Assistant Examiner*—Jhihan B. Clark
*Attorney, Agent, or Firm*—Luedeka, Neely & Graham, P.C.

[57] ABSTRACT

An integrated circuit having an outer ring of bonding pads which is positioned so as to be adjacent to and concentric with the perimeter of the integrated circuit. The outer ring of bonding pads extends for at least a first portion of the perimeter. An inner ring of bonding pads is positioned interior of, adjacent to, and concentric with the first ring of bonding pads. The inner ring of bonding pads extends for at least a second portion of the perimeter. The first portion is greater than the second portion, or in other words, the outer ring of bonding pads extends further around the integrated circuit than the inner ring of bonding pads. In addition, the outer ring of bonding pads has a greater number of bonding pads that the inner ring of bonding pads. Traces are electrically connected to the bonding pads of the inner and outer rings, such that each pad is electrically connected to a unique trace, meaning that each pad has a trace which is associated with just that pad and with no other pad. The pads of the inner and outer rings are staggered such that adjacent pads of the inner ring are separated by at least two of the traces which are connected to pads of the outer ring. By staggering the inner and outer rings of pads in this manner, pad density, ease of manufacture, and reliability are increased. By having the rings of pads progress around only a first and second portion of the perimeter of the integrated circuit, no space is taken up by bonding pads that are not required. For example, the outer ring of pads may extend all the way around the perimeter of the integrated circuit, and the inner ring of pads may only extend half way around the perimeter of the integrated circuit, because additional bonding pads are not required by the circuit.

13 Claims, 3 Drawing Sheets

PROGRESSIVE STAGGERED BONDING PADS

FIELD OF THE INVENTION

This invention is a continuation-in-part of co-pending application Ser. No. 08/660,490, filed Jun. 7, 1996, the disclosure of which is included herein in its entirety by reference. This invention relates to the field of integrated circuit manufacturing technology. In particular the invention relates to bonding pad placement on wire bonded devices.

BACKGROUND OF THE INVENTION

Integrated circuits are typically packaged prior to their ultimate use, to protect the circuit from damage. Thus, it is necessary to provide for electrical connections from the circuit to the structure in which it is packaged. One method of making these electrical connections is termed wire bonding.

Wire bonds are made by electrically connecting one end of a wire to the circuit, and the other end of the wire to the package. The portion of the integrated circuit which makes contact with the wire is called a bonding pad, and the portion of the package which makes contact with the wire is called a bond finger. Bonding pads are typically placed around the perimeter of the integrated circuit, so that the wires do not cross over the top of the circuit. This reduces wire shorting, and allows the wires to be shorter.

As integrated circuit processing technology has advanced, the size of circuit elements has decreased. Thus, more circuit elements can fit into an integrated circuit of a given size. This requires an increase in the number of bonding pads to electrically connect all of the circuit elements. The bonding pads on an integrated circuit tend to require a significant portion of the surface area of the chip. Since the space required by bonding pads increases the overall cost of the integrated circuit, manufacturers are motivated to reduce the amount of space required by the bonding pads.

One method of reducing the space required by the bonding pads is to make the pads themselves smaller, or decrease the pitch between adjacent pads. However, this creates problems when the bonding wires are attached, as there is an increased probability that a wire connected to one pad will short with an adjacent pad.

What is needed, therefore, is a method of providing bonding pads on an integrated circuit which provides for an increased number of bonding pads within a given amount of space, while reducing the probability of shorting, and using no more of the surface area on the integrated circuit than necessary.

SUMMARY OF THE INVENTION

The above and other needs are provided by an integrated circuit having an outer ring of bonding pads which is positioned so as to be adjacent to and concentric with the perimeter of the integrated circuit. The outer ring of bonding pads extends for at least a first portion of the perimeter. An inner ring of bonding pads is positioned interior of, adjacent to, and concentric with the first ring of bonding pads. The inner ring of bonding pads extends for at least a second portion of the perimeter. The first portion is greater than the second portion, or in other words, the outer ring of bonding pads extends further around the edge of the integrated circuit than the inner ring of bonding pads. In addition, the outer ring of bonding pads has a greater number of bonding pads than the inner ring of bonding pads. Traces are electrically connected to the bonding pads of the inner and outer rings, such that each pad is electrically connected to a unique trace, meaning that each pad has a trace which is associated with just that pad and with no other pad. The pads of the inner and outer rings are, in a preferred embodiment, staggered such that adjacent pads of the inner ring are separated by at least two of the traces which are connected to pads of the outer ring.

By staggering the inner and outer rings of pads in this manner, pad density, ease of manufacture, and reliability are increased. By having the rings of pads progress around only a first and second portion of the perimeter of the integrated circuit, no space is taken up by bonding pads that are not required. For example, the outer ring of pads may extend all the way around the perimeter of the integrated circuit, and the inner ring of pads may only extend half way around the perimeter of the integrated circuit, because additional bonding pads are not required by the circuit.

In a preferred embodiment the integrated circuit is packaged in combination with a package substrate for receiving the integrated circuit. The package substrate has an inner ring of bond fingers adjacent to and concentric with the perimeter of the integrated circuit. The inner ring of bond fingers extends for at least a third portion of the perimeter. An outer ring of bond fingers is positioned exterior of, adjacent to, and concentric with the first ring of bond fingers. The outer ring of bond fingers extends for at least a fourth portion of the perimeter. A first set of wires is used to electrically connect at least a portion of the outer ring of bonding pads with at least a portion of the inner ring of bond fingers. The wires of the first set rise to a first height. A second set of wires is used to electrically connect at least a portion of the inner ring of bonding pads with at least a portion of the outer ring of bond fingers. The wires of the second set rise to a second height, which is greater than the first height.

By running wires in two sets, the first set between the outer ring of pads and the inner ring of fingers, and the second set between the inner ring of pads and the outer ring of fingers, more open space is provided between the wires. The first set rises to a height that is lower than the second set, and thus the two sets do not conflict with or cross each other. In this manner, the likelihood of shorting between wires is reduced.

In further preferred embodiments, either the first or second set of bonding pads, or both sets, are positioned in a non-contiguous manner. In other words, the outer set of bonding pads may extend along two opposing sides of the integrated circuit, for example, and the inner set of bonding pads may be positioned at either end of the two non-contiguous sections of the first set, but not be positioned in the middle of either of the two non-contiguous sections. Again, the benefit is an increase in the pad density where it is required, while having no more bonding pads than needed by the electrical requirements of the integrated circuit.

In a method according to the present invention, an integrated circuit is electrically connected to a package substrate. An outer ring of bonding pads is provided adjacent to and concentric with the perimeter of the integrated circuit. The outer ring of pads is extended for at least a first portion of the perimeter, and each pad of the outer ring of bonding pads is electrically connected with a unique electrical trace. An inner ring of bonding pads is provided interior of, adjacent to, and concentric with the outer ring of bonding pads. The inner ring of pads is extended for at least a second portion of the perimeter, where the first portion of the perimeter is greater than the second portion of the perimeter. Each pad of the inner ring of bonding pads is also electrically connected with a unique electrical trace.

The pads of the inner and outer rings of bonding pads are staggered such that adjacent pads of the inner ring are separated by at least two of the traces that are connected to pads of the outer ring. At least a portion of the outer ring of bonding pads are electrically connected with a first set of wires to at least a portion of an inner ring of bond fingers on the package substrate. The first set of wires rises to a first height. At least a portion of the inner ring of bonding pads are electrically connected with a second set of wires to at least a portion of an outer ring of bond fingers on the package substrate. The second set of wires rises to a second height, which is greater than the first height.

BRIEF DESCRIPTION OF THE DRAWINGS

The preferred embodiments of the invention will now be described in further detail with reference to the drawings wherein like reference characters designate like or similar elements throughout the several drawings as follows.

DETAILED DESCRIPTION OF PREFERRED EMBODIMENTS

In the discussion below, the staggered nature of the bonding pads will first be discussed, and then the benefits of the progressive nature of the bonding pads will be discussed.

Figure 1:
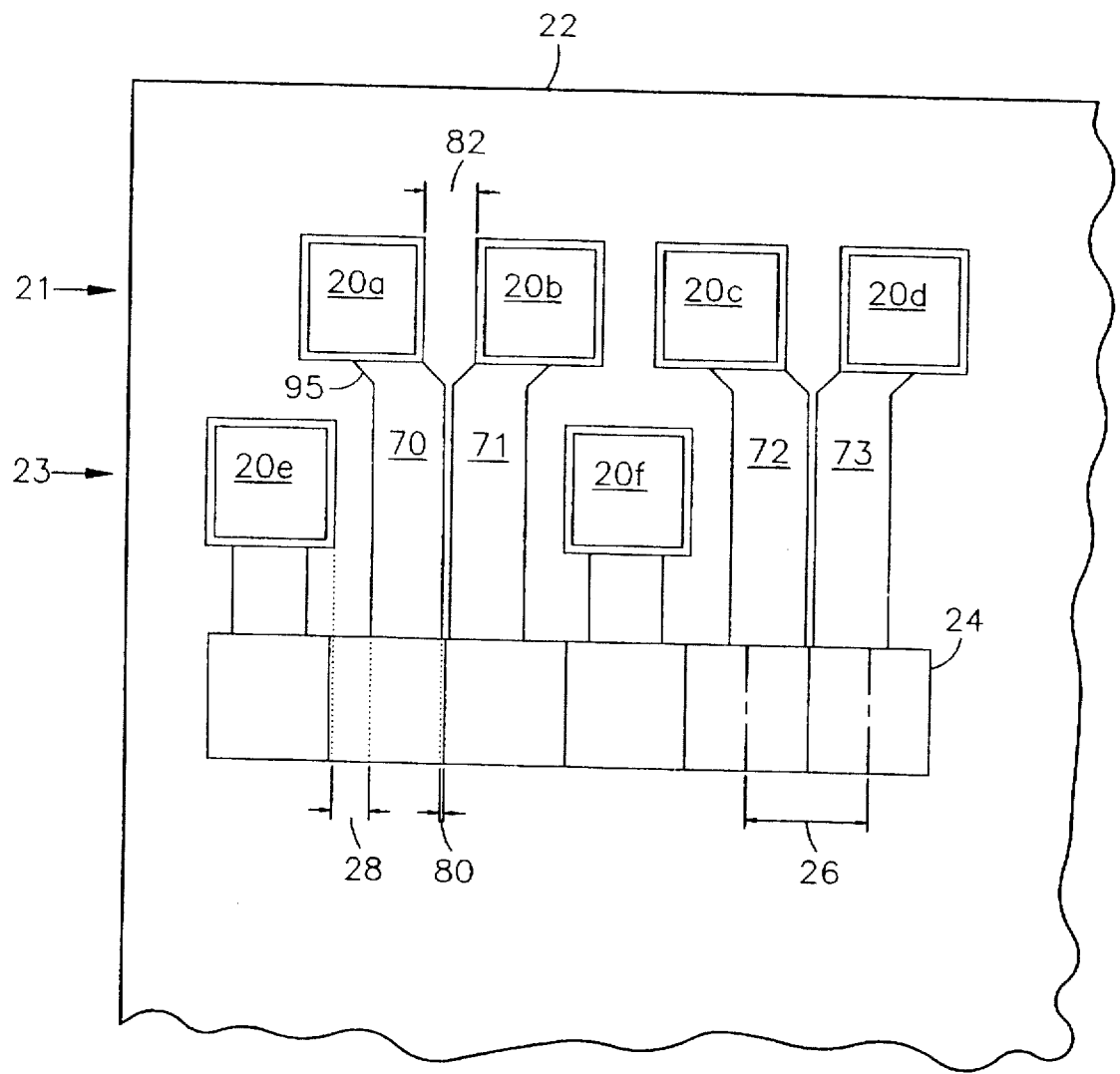
FIG. 1 is a partial top plan view of a die employing a two-to-one embodiment of the stagger pattern of the present invention.

To improve manufacturability, yield, and reliability as integrated circuit die sizes are reduced, the present invention provides for the use of bonding pads arranged in a staggered pattern as shown in FIG. 1. As FIG. 1 illustrates, bonding pads 20a–20f are geometrically arranged on an integrated circuit die 22 in two rings. The outer ring, closest to the edge of the die 22, includes bonding pads 20a–20d and is generally designated at 21. The inner ring, closest to the center of the die 22, includes bonding pads 20e–20f and is generally designated at 23. The outer ring 21 contains a greater number of pads than does the inner ring 23. In a preferred embodiment, outer ring 21 contains twice as many bonding pads as inner ring 23, so that a two-to-one relationship exists between the two rings (e.g., there are two pads in the outer ring 21 for every one pad in the inner ring 23). Outer ring 21 traces 70, 71, 72, and 73 are each routed between an inner ring 23 pad 20e–20f and an outer ring 21 trace 70–73. For example, outer ring 21 trace 70 is routed between inner ring 23 pad 20e and outer ring 21 trace 71.

With continued reference to FIG. 1, the outer ring 21 traces 70–73 are arranged in pairs 70, 71 and 72, 74, where each pair of outer ring 21 traces 70–73 is routed between two inner ring 23 pads 20e–20f. At the point of connection 95 to the outer ring 21 pads 20a–20d, each outer ring 21 trace 70–73 may be angled to take advantage of the available pad gap 82 between each of the outer ring 21 pads 20a–20d, so that the trace gap 80 between each pair of outer ring 21 traces 70–73 is relatively small, preferably about 1 μ. I/O buffer pitch 26, defined as the center-to-center distance between each of the I/O buffers in the buffer ring 24, is preferably 2.9 mils (74.8μ) and trace width is preferably 50.0 μ.

Given a constant bonding pad 20a–20f size and a constant trace 70–73 width, the stagger pattern of FIG. 1 provides a larger trace-to-pad gap 28 than is typically provided by the prior art. This larger gap 28 enables greater tolerance of bonding pad 20a–20f misalignment. In other words, a greater amount of error during manufacturing in the misplacement of bonding wires can be tolerated with the stagger pattern of FIG. 1, because there is more room for error. The result is better manufacturability, improved yields, and increased reliability. Electromigration problems are also reduced by keeping traces 70–73 wider.

Figure 2:
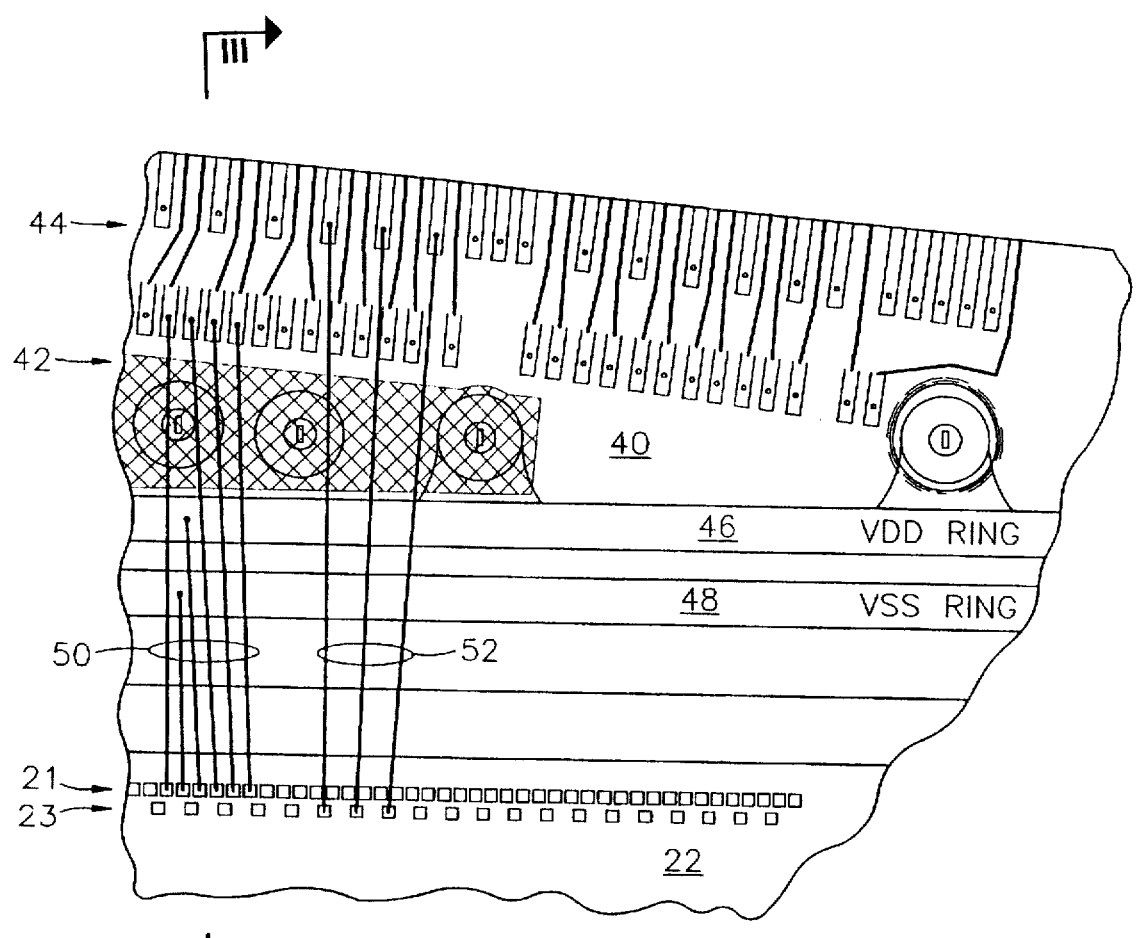
FIG. 2 is a partial top plan view of an integrated circuit showing wire connections between a die having a two-to-one bonding pad stagger pattern and a package substrate having two rings of bond fingers.

As depicted in FIG. 2, two rings of bond fingers, an inner ring 42 and an outer ring 44, preferably positioned in a common plane, may be provided on the package substrate 40. In an alternate embodiment a single ring of bond fingers 42 is provided. However, given the present state of wire bonding technology, this alternate embodiment is not preferred because bonding the same size die 22 to a single ring of bond fingers 42 requires a greater distance between the bond fingers 42 and bonding pads 20a–20f when using the same minimum width for bond fingers 42 on the substrate 40. This results in the use of longer wires which exhibit greater inductance than the shorter wire lengths that can be used for bonding to a two bond finger substrate 40. Longer wires also allow greater sweep and sagging which causes lower yield due to shorting.

With continued reference to FIGS. 1 and 2, bonding pads 20a–20d in ring 21 closest to the edge of the die 22 are wire bonded (as represented by wires 50) to the inner ring of bond fingers 42 located on the package substrate 40, or to the Vdd (power) ring 46, or to the Vss (ground) ring 48. Bonding pads 20e–20f in ring 23 closest to the center of the die 22 are wire bonded (as represented by wires 52) to the outer ring of bond fingers 44 on the substrate 40. Since more bonding pads 20a–20d are positioned in ring 21 than in ring 23, a correspondingly greater number of bond fingers are contained in ring 42 than in ring 44 of the package substrate 40.

Figure 3:
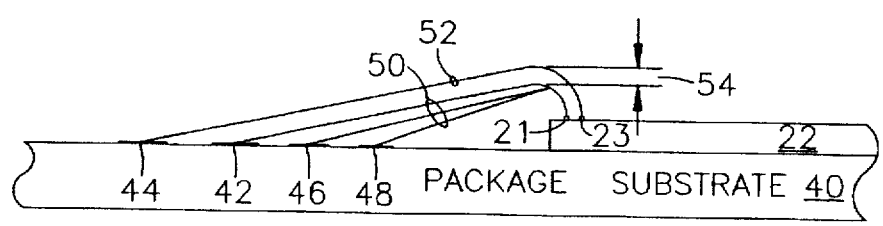
FIG. 3 is a cross-sectional view of the die and substrate of FIG. 2, showing the two differing wire loop heights used for bonding the die to the substrate.

As FIG. 3 illustrates, two different wire loop heights are used to electrically connect the die 22 to the substrate 40, thereby further improving wire clearances to minimize the potential for having crossed or shorted wires. During the wire bonding process, the bonding pads 20a–20d of the outer ring 21 are bonded to inner bond finger ring 42, power ring 46, or ground ring 48 using a first wire loop height. The bonding pads 20e–20f of the inner ring 23 are bonded to outer bond finger ring 44 using a second wire loop height that is greater than the first wire loop height. The difference between the first and second wire loop heights is indicated at 54. The use of two different wire loop heights improves manufacturability during the wire bonding process. This in turn improves manufacturability yield and reliability. The ASIC (application specific integrated circuit) designer is also provided with greater flexibility in assigning bonding pads.

Referring again to FIGS. 1 and 2, it is advantageous to locate a greater number of bonding pads in the ring 21 closest to the edge of the die 22, since this enables more signals to be wire bonded to the inner ring 42 of bond fingers on the substrate 40. This simplifies wire bonding the relatively longer wires for the remaining signals from bonding pad ring 23 on the die 22 to bond finger ring 44 on the substrate 40. The invention also provides for a greater number of short length wires having less inductance than wires of longer lengths, thereby improving electrical parasitics in a majority of the signals in the package.

Having thus described the staggered nature of the bonding pads, the benefits of the progressive nature of the bonding pads will now be discussed.

Figure 4:
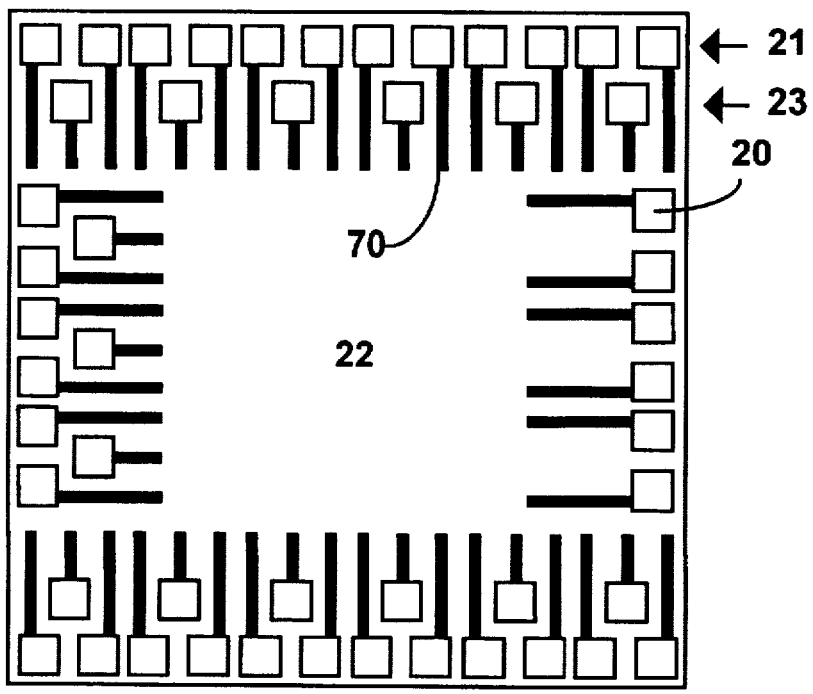
FIG 4 is a top plan view of an integrated circuit depicting progressive bonding pads.

Depicted in FIG. 4 is an integrated circuit 22, on which there are provided an outer ring of bonding pads 21 and an inner ring of bonding pads 23. As can be seen, the outer ring of bonding pads 21 extends for a first portion of the perimeter, which in the example depicted is the entire perimeter of the integrated circuit 22. The inner ring of bonding pads 23 extends for a second portion of the perimeter, which in the example depicted is about three quarters of the perimeter. As can be seen, there are at least two traces 70, connected to a bonding pad of the outer ring 21, between each of the bonding pads of the inner ring 23.

It will be appreciated that the inner and outer rings of bonding pads 23 and 21, and the traces generally indicated as 70, have been greatly enlarged in relation to the size of the integrated circuit 22, so that the important aspects of the present invention can be more easily seen and clearly understood.

In the example depicted, the outer ring 21 extends around the entire perimeter because at least that number of bonding pads is required. The inner ring 23 does not extend around the entire perimeter because no more bonding pads are required. Thus, it is an important aspect of the invention that no more space be used for bonding pads than is needed by the electrical requirements of the integrated circuit 22.

Figure 5:
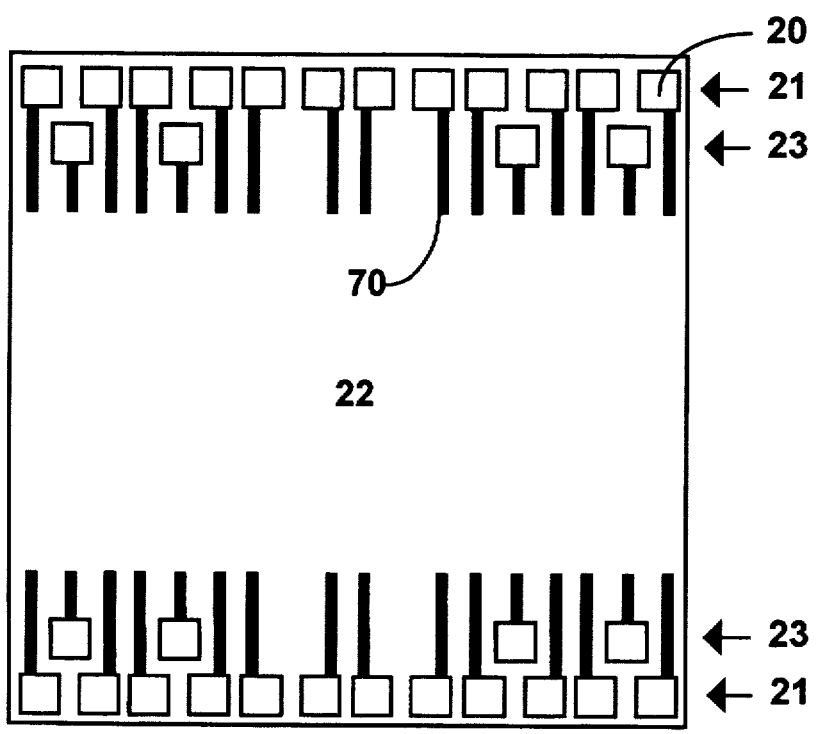
FIG. 5 is a top plan view of an integrated circuit depicting non-contiguous progressive bonding pads.

In FIG. 5 the non-contiguous nature of the bonding pads is depicted. In this example the outer ring 21 is provided in two non-contiguous sections, located generally at the top and bottom of the integrated circuit 22. The inner ring 23 is provided in four non-contiguous sections, located generally at the left and right ends of the two outer ring sections 21. Again, there are at least two traces 70 between each of the bonding pads of the inner ring 23.

Thus, by providing the bonding pads in a staggered fashion, a higher density of bonding pads is realized on the integrated circuit 22, and by extending the two rows of bonding pads only as far around the perimeter of the integrated circuit 22 as necessary, in a progressive manner, more space is made available for other circuit elements.

It is contemplated, and will be apparent to those skilled in the art, from the foregoing specification, drawings, and examples, that modifications or changes may be made in the embodiments of the invention. Accordingly, it is expressly intended that the foregoing are illustrative of preferred embodiments only, not limiting thereto, and that the true spirit and scope of the present invention be determined by reference to the appended claims.

What is claimed is:

1. An integrated circuit comprising:

an outer ring of bonding pads adjacent to and concentric with the perimeter of the integrated circuit, and extending for at least a first portion of the perimeter, an inner ring of bonding pads interior of, adjacent to, and concentric with the outer ring of bonding pads, and extending for at least a second portion of the perimeter, the first portion being longer than the second portion, the outer ring of bonding pads having a greater number of bonding pads than the inner ring of bonding pads, traces electrically connected to the bonding pads of the inner and outer rings, each pad connected to a unique trace, and the pads of the inner and outer rings staggered such that adjacent pads of the inner ring are separated by at least two traces connected to pads of the outer ring.

2. The circuit of claim 1 wherein the outer ring of bonding pads is non-contiguous.

3. The circuit of claim 1 wherein the inner ring of bonding pads is non-contiguous.

4. The circuit of claim 1 wherein the inner and outer rings of bonding pads are non-contiguous.

5. A packaged integrated circuit comprising:

an integrated circuit having;

an outer ring of bonding pads adjacent to and concentric with the perimeter of the integrated circuit, and extending for at least a first portion of the perimeter, an inner ring of bonding pads interior of, adjacent to, and concentric with the outer ring of bonding pads, and extending for at least a second portion of the perimeter, the first portion being longer than the second portion, the outer ring of bonding pads having a greater number of bonding pads than the inner ring of bonding pads, traces electrically connected-to the bonding pads of the inner and outer rings, each pad connected to a unique trace, and the pads of the inner and outer rings staggered such that adjacent pads of the inner ring are separated by at least two traces connected to pads of the outer ring;

a package substrate for receiving the integrated circuit, having;

an inner ring of bond fingers adjacent to and concentric with the perimeter of the integrated circuit, and extending for at least a third portion of the perimeter, an outer ring of bond fingers interior of, adjacent to, and concentric with the inner ring of bond fingers, and extending for at least a fourth portion of the perimeter;

a first set of wires electrically connecting at least a portion of the outer ring of bonding pads with at least a portion of the inner ring of bond fingers, the wires of the first set rising to a first height, and a second set of wires electrically connecting at least a portion of the inner ring of bonding pads with at least a portion of the outer ring of bond fingers, the wires of the second set rising to a second height which is greater than the first height.

6. The circuit of claim 5 wherein the outer ring of bonding pads is non-contiguous.

7. The circuit of claim 5 wherein the inner ring of bonding pads is non-contiguous.

8. The circuit of claim 5 wherein the inner and outer rings of bonding pads are non-contiguous.

9. The circuit of claim 5 further comprising the inner ring of bond fingers having a greater number of bond fingers than the outer ring of bond fingers.

10. An integrated circuit comprising:

an outer ring of bonding pads adjacent to and concentric with the perimeter of the integrated circuit, and extending for at least a first portion of the perimeter, an inner ring of bonding pads interior of, adjacent to, and concentric with the outer ring of bonding pads, and extending for at least a second portion of the perimeter, the first portion being longer than the second portion, the outer ring of bonding pads having a greater number of bonding pads than the inner ring of bonding pads, traces electrically connected to the bonding pads of the inner and outer rings, each pad connected to a unique trace, and the pads of the inner ring being staggered with respect to the pads of the outer ring.

11. The circuit of claim 10 wherein the outer ring of bonding pads is non-contiguous.

12. The circuit of claim 10 wherein the inner ring of bonding pads is non-contiguous.

13. The circuit of claim 10 wherein the inner and outer rings of bonding pads are non-contiguous.

* * * * *